(12) United States Patent
Sun

(10) Patent No.: US 8,611,099 B2
(45) Date of Patent: Dec. 17, 2013

(54) ELECTRONIC DEVICE WITH DETACHABLE MODULE

(75) Inventor: Zheng-Heng Sun, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 151 days.

(21) Appl. No.: 13/403,925

(22) Filed: Feb. 23, 2012

(65) Prior Publication Data

US 2013/0176690 A1 Jul. 11, 2013

(30) Foreign Application Priority Data

Jan. 11, 2012 (CN) .......................... 2012 1 0006617

(51) Int. Cl.
*H05K 5/00* (2006.01)

(52) U.S. Cl.
USPC ............ 361/754; 361/725; 361/756; 361/801

(58) Field of Classification Search
USPC ......... 361/683, 684, 725–727, 747, 756, 758, 361/759, 796, 800–802; 312/215, 222, 216, 312/333, 223.1, 223.2; 24/572.1, 633, 640
See application file for complete search history.

(56) References Cited

U.S. PATENT DOCUMENTS

| 5,918,956 | A  | * | 7/1999 | Scholder ..................... 312/223.2 |
| 6,556,437 | B1 | * | 4/2003 | Hardin ..................... 361/679.48 |
| 6,665,908 | B1 | * | 12/2003 | Mease ............................. 16/422 |
| 7,540,575 | B2 | * | 6/2009 | Mau ........................... 312/223.2 |
| 8,070,242 | B2 | * | 12/2011 | Makabe ..................... 312/223.1 |
| 8,238,118 | B2 | * | 8/2012 | Li et al. ......................... 361/807 |
| 2008/0013271 | A1 | * | 1/2008 | Peng et al. .................... 361/684 |
| 2012/0293975 | A1 | * | 11/2012 | Liang ............................ 361/807 |

* cited by examiner

*Primary Examiner* — Hung S Bui
(74) *Attorney, Agent, or Firm* — Altis Law Group, Inc.

(57) ABSTRACT

An electronic device includes a chassis, a detachable module with a case received in the chassis, a resilient latching member, and an operation member slidably positioned between the latching member and the case. The chassis defines a fastening hole. The case defines a through hole. A first end of the latching member is fixed to the case. A latching tab protrudes outwards from a second end of the latching member. When the operation member is at a first position, the latching tab engages in the fastening hole such that the detachable module is attached to the chassis. When the operation member slides to a second position, it pushes against the latching member to deform the second end of the latching member to move away from the case, such that the latching tab is disengaged from the fastening hole, thereby detaching the detachable module from the chassis.

9 Claims, 9 Drawing Sheets

ELECTRONIC DEVICE WITH DETACHABLE MODULE

BACKGROUND

1. Technical Field

The present disclosure relates to an electronic device having a detachable module.

2. Description of Related Art

In an electronic device, such as a computer or a server, some modules, such as power modules, are usually fixed in a chassis of the electronic device by screws. However, it is time-consuming and often difficult to disassemble those modules from the electronic device when they need to be replaced. Therefore it would be desirable that such modules are detachably assembled to the electronic device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
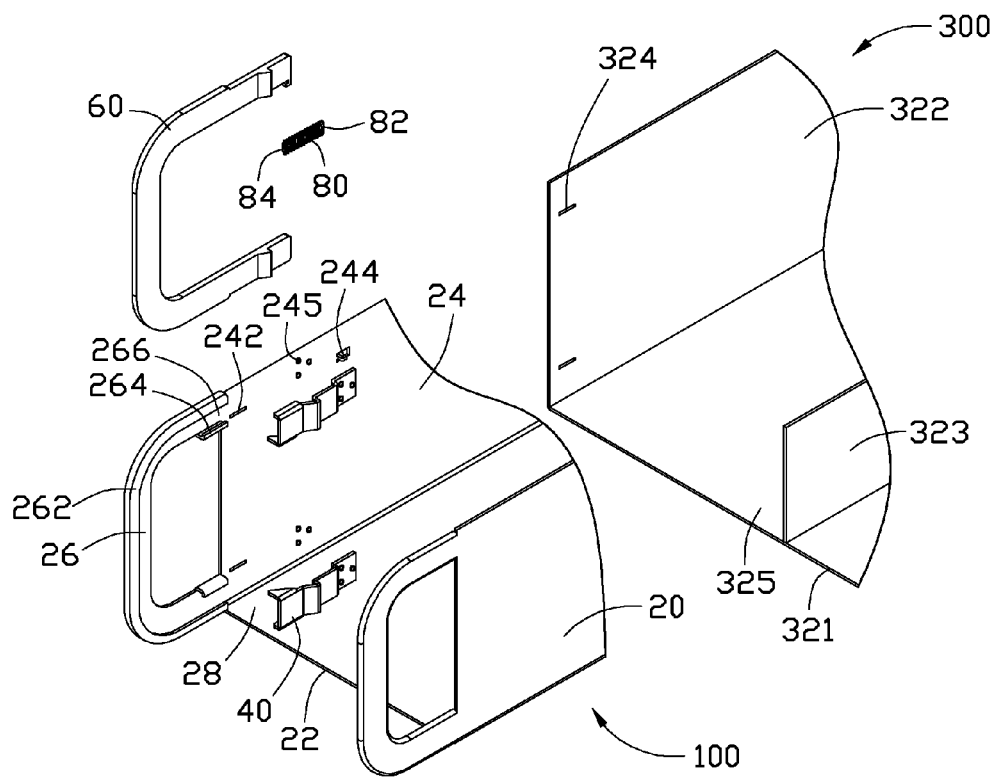
FIG. 1 is an exploded, isometric view of a first embodiment of an electronic device, wherein the electronic device includes two latching members and an operation member.
Figure 2:
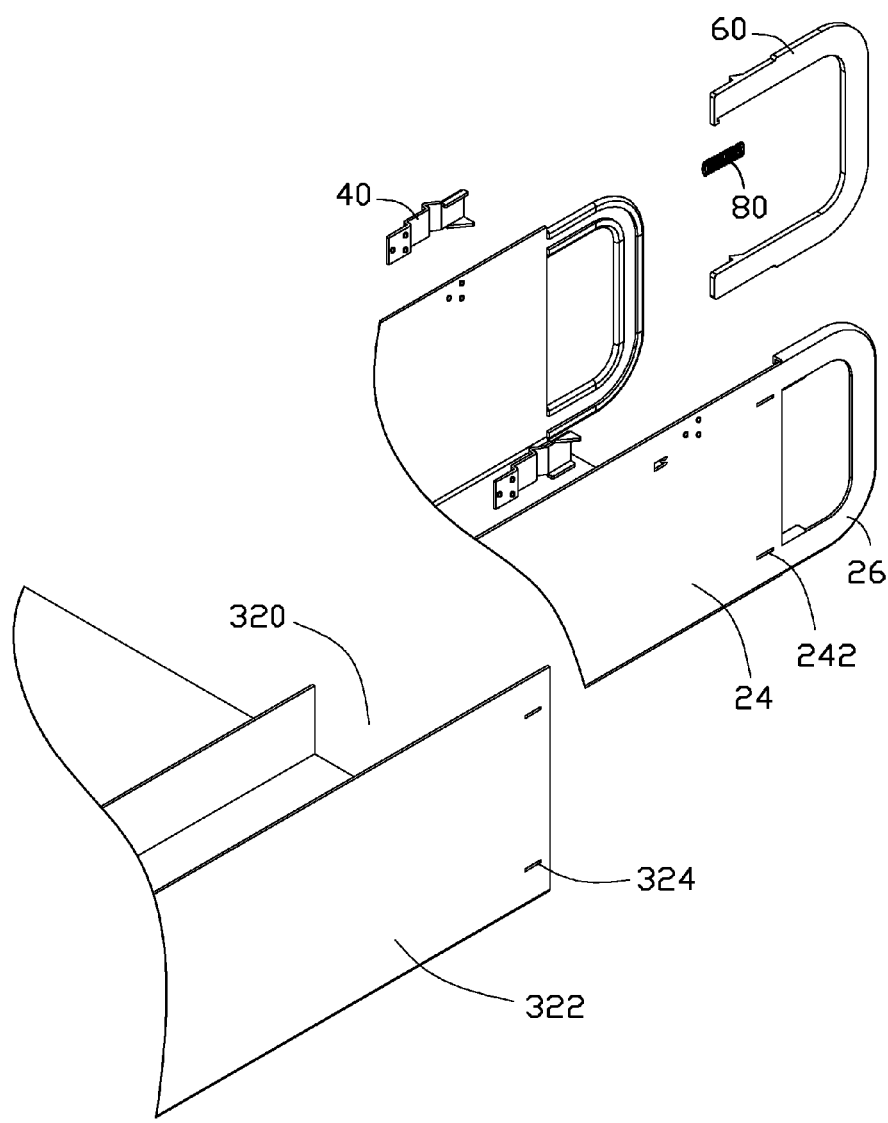
FIG. 2 is similar to FIG. 1, but viewed from another perspective.

Referring to FIG. 1 and FIG. 2, a first embodiment of an electronic device includes a chassis 300 and a detachable module 100. A plurality of components (not shown), such as a motherboard and a storage apparatus, is installed in the chassis 300. The detachable module 100 includes a case 20, two resilient latching members 40, an operation member 60, and an elastic member 80. In the embodiment, the chassis 300 is a server enclosure; the detachable module 100 is a power module.

The chassis 300 includes a rectangular bottom wall 321, a sidewall 322 perpendicularly extending up from a side of the bottom wall 321, and an engaging plate 323 perpendicularly extending up from the bottom wall 321 and parallel to the sidewall 322. The bottom wall 321, the sidewall 322, and the engaging plate 323 cooperatively bound a receiving space 325. An end of the sidewall 322 defines two fastening holes 324 communicating with the receiving space 325.

The case 20 includes a rectangular bottom plate 22, two side plates 24 perpendicularly extending up from two opposite sides of the bottom plate 22, and two U-shaped handles 26 each extending outward from an end of a corresponding side plate 24. The bottom plate 22 and the side plates 24 cooperatively bound a receiving space 28. One of the side plates 24 defines two through holes 242 respectively adjacent to two ends of the handle 26, and a plurality of connecting holes 245 adjacent to the through holes 242. A hook 244 protrudes from the side plate 24 toward the receiving space 28. An L-shaped flange 262 extends inwards from an outer edge of the handle 26. Two L-shaped positioning pieces 264 extend in from an inner edge of the handle 26 and at the ends of the handle 26, adjacent to the side plate 24. The flange 262 and the positioning piece 264 cooperatively bound a slide slot 266.

Figure 3:
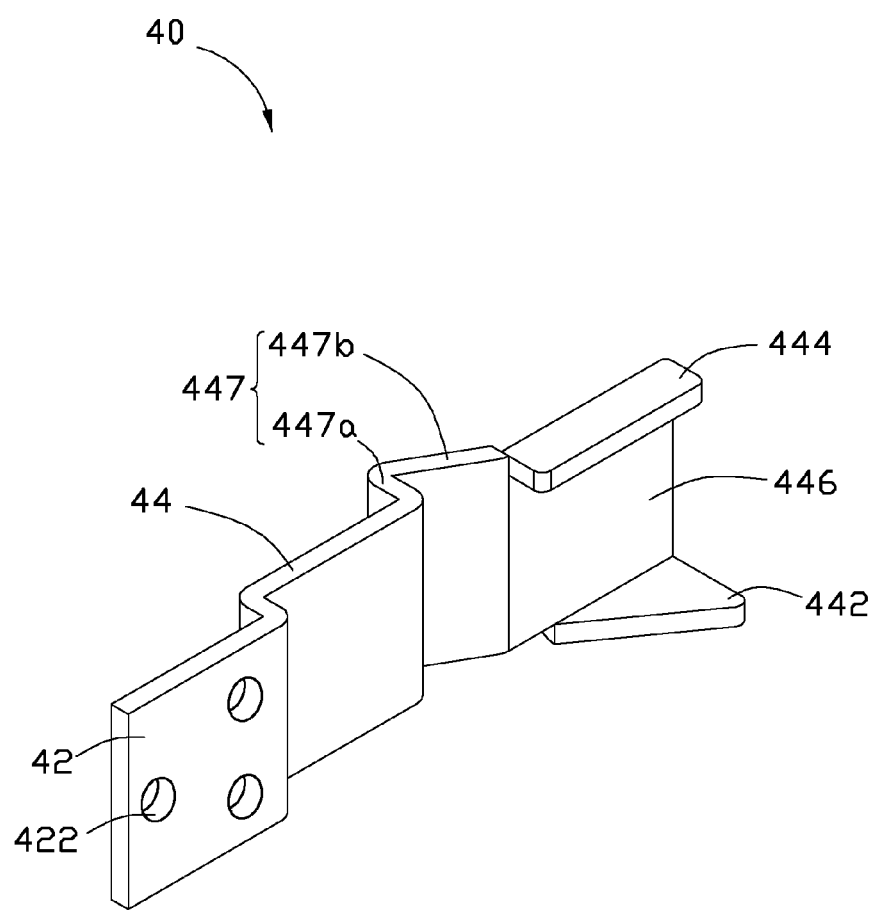
FIG. 3 is an enlarged view of one of the latching members of FIG. 2.

Referring to FIG. 3, each latching member 40 includes a resilient latching plate 44 and a fixing plate 42 slantingly extending outwards from a first end of the latching plate 44. A wedge-shaped latching tab 442 perpendicularly extends outwards from a first side of a second end of the latching plate 44. A guiding piece 444 perpendicularly extends outwards from a second side of the second end of the latching plate 44 opposite to the latching tab 442. The latching plate 44, the latching tab 442, and the guiding piece 444 cooperatively bound a guiding slot 446. A V-shaped bending portion 447 extends outwards from a middle of the latching plate 44, away from the fixing plate 42 and the latching tab 442. The bending portion 447 includes a stopping piece 447a perpendicularly extending outwards from the latching plate 44, and an engaging piece 447b slantingly connected between a distal end of the stopping piece 447a and the latching plate 44. The fixing plate 42 defines a plurality of fixing holes 422.

Figure 4:
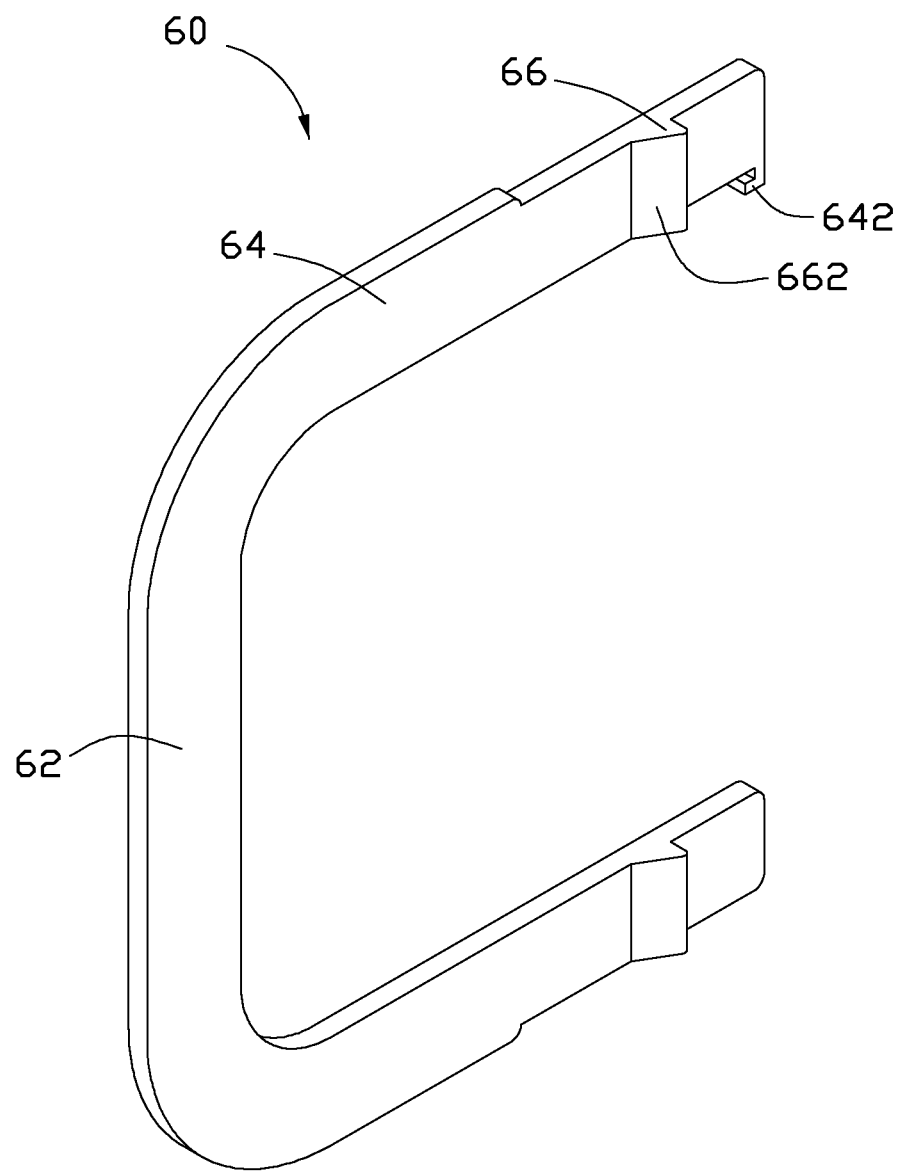
FIG. 4 is an enlarged view of the operation member of FIG. 1.

Referring to FIG. 4, the operation member 60 is substantially U-shaped, and includes two parallel sliding arms 64, and an operation arm 62 perpendicularly connected between first ends of the sliding arms 64. A wedge-shaped protrusion 66 protrudes outwards from a second end of each sliding arm 64. A slantwise guiding surface 662 is formed on each protrusion 66, facing the operation arm 62. A hook 642 extends from the second end of one of the sliding arms 64, toward the other sliding arm 64.

In the embodiment, the elastic member 80 is a coil spring, and includes a first end 82, and a second end 84 opposite to the first end 82.

Figure 5:
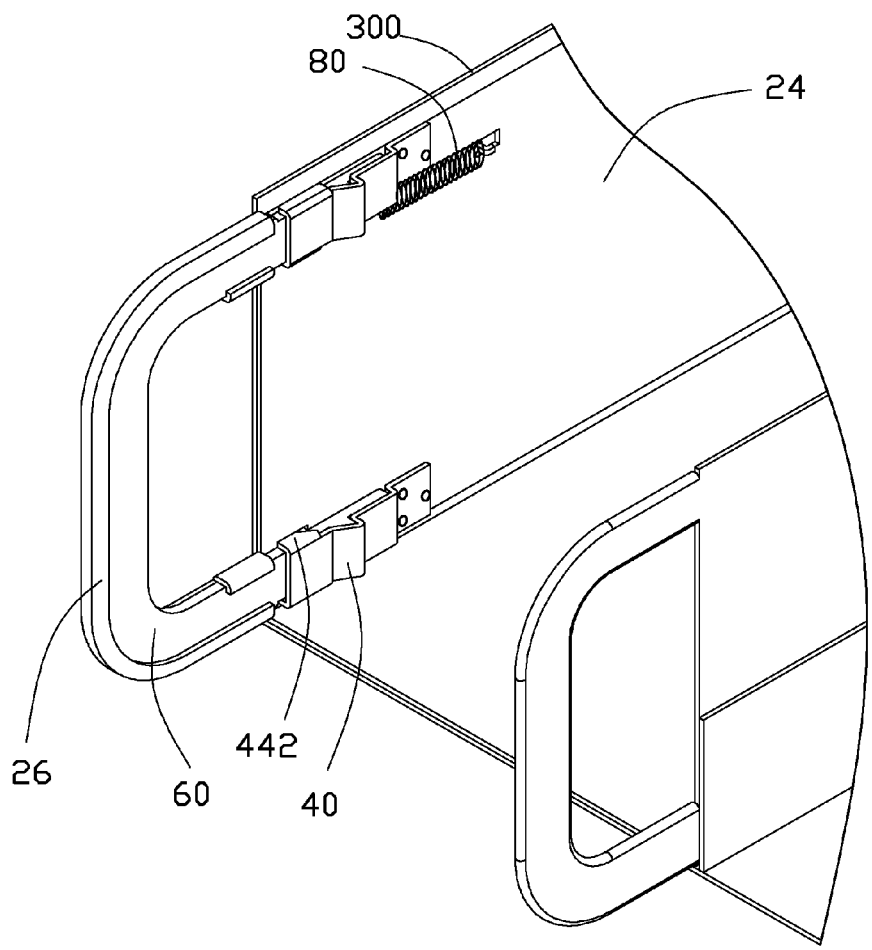
FIG. 5 is an assembled, isometric view of the electronic device of FIG. 1.
Figure 6:
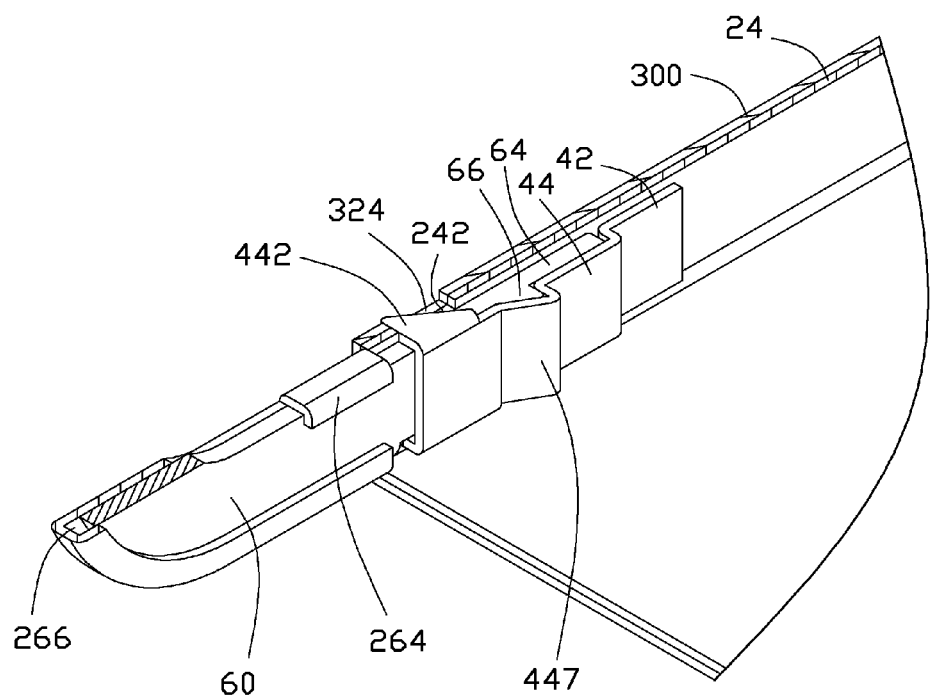
FIG. 6 is an enlarged and cutaway view of the electronic device of FIG. 5.

Referring to FIG. 5 and FIG. 6, in assembly, the operation member 60 is slidably received in the sliding slot 266. The protrusion 66 faces toward the opposite side plate 24. Each latching member 40 is located within the receiving space 28. A plurality of fasteners extends through the fixing holes 422, to be fastened into the corresponding connecting holes 245. The first end 82 of the elastic member 80 is fastened to the hook 244 of the case 20, and the second end 84 is fastened to the hook 642 of the operation member 60. The latching tabs 442 extend through the corresponding through holes 242, and expose out of the side plates 24. The distal end of each sliding arm 64 is slidably received in the corresponding guiding slot 446. Each protrusion 66 is received in the corresponding bending portion 447, and the guiding surface 662 is slidably engaged with the engaging piece 447b.

In assembly of the detachable module 100 to the chassis 300, an end of the case 20 away from the handles 26 is inserted into the receiving space 325. The latching tabs 442 slidably abut against the inner surface of the sidewall 322, deforming the latching plates 44 toward the receiving space 28. When the latching tabs 442 move to align with the corresponding through holes 242, the latching plates 44 are then self-restored to urge the latching tabs 442 to engage into the corresponding fastening holes 324.

Figure 7:
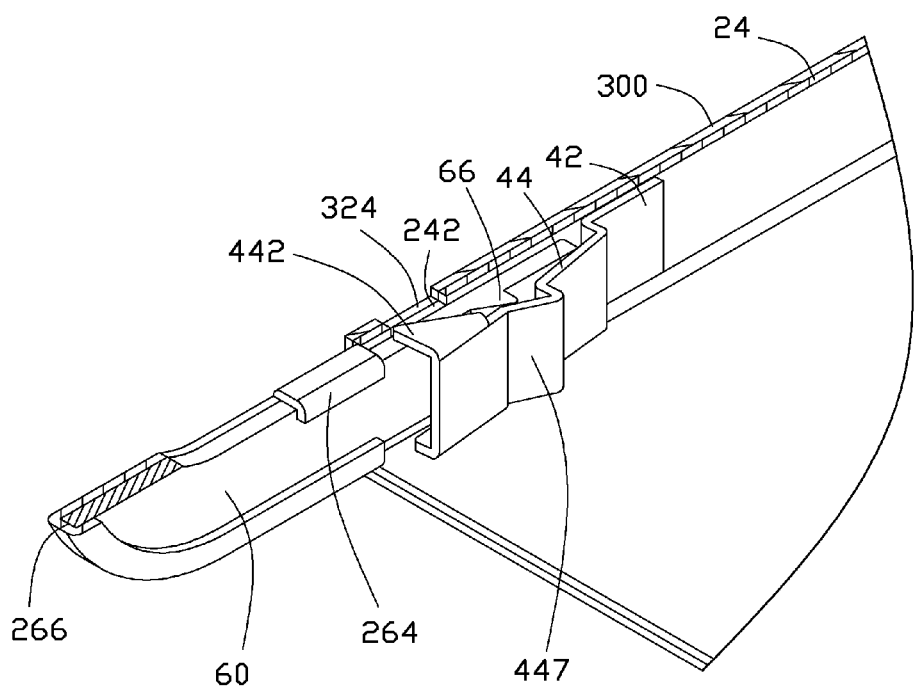
FIG. 7 is similar to FIG. 6, but shows a different state of use.

Referring to FIG. 7, when disassembling the detachable module 100, the operation arm 62 is moved away from the chassis 300 along the sliding slot 266, thereby deforming the elastic member 80. The guiding surface 662 of each protrusion 66 slidably abuts against the corresponding engaging piece 447b, deforming the latching plate 44. The latching tabs 442 are disengaged from the corresponding fastening holes 324. The handles 26 are pulled to move away from the chassis 300 along the receiving space 325. Therefore, the detachable module 100 may be easily separated from the chassis 300. The operation member 60 is released, the elastic member 80 and the latching members 40 are restored to urge the operation member 60 to return.

Figure 8:
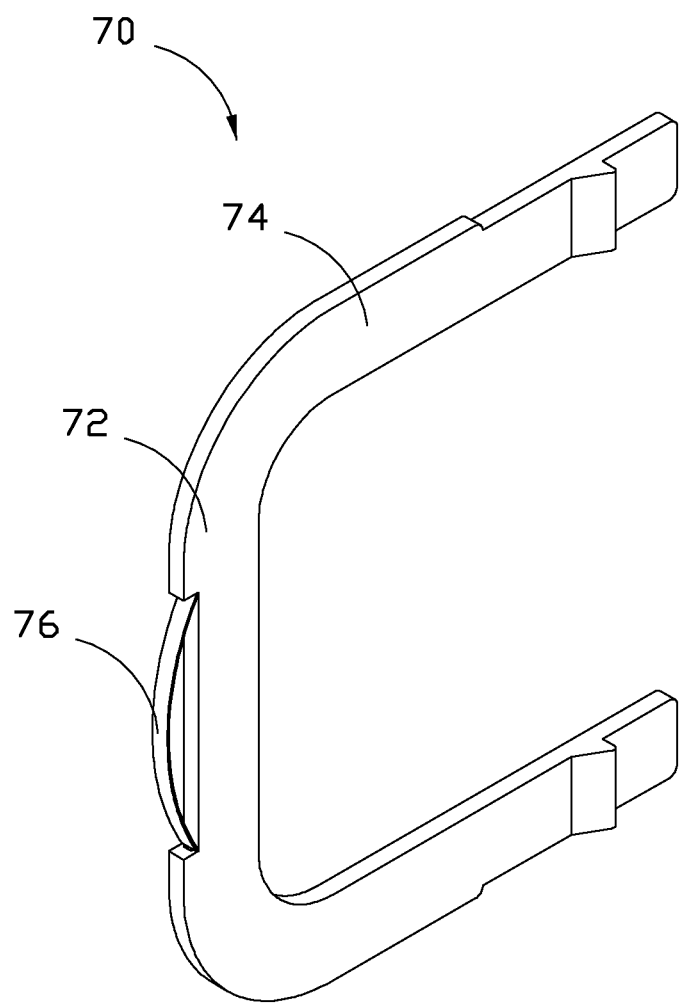
FIG. 8 is an isometric view of an operation member of a second embodiment of an electronic device.

Referring to FIG. 8, a second embodiment of an electronic device is substantially similar to the first embodiment of the electronic device, except that an operation member 70 of the electronic device of the second embodiment includes two parallel sliding arms 74, and an operation arm 72 perpendicularly connected between first ends of the sliding arms 74. An arc-shaped resilient piece 76 extends from an outside surface of the operation arm 72 away from the sliding arms 74. The resilient piece 76 abuts against an inner surface of the flange 262, to urge the operation member 70 to be self-restored, thereby replacing the resilient member 80.

Figure 9:
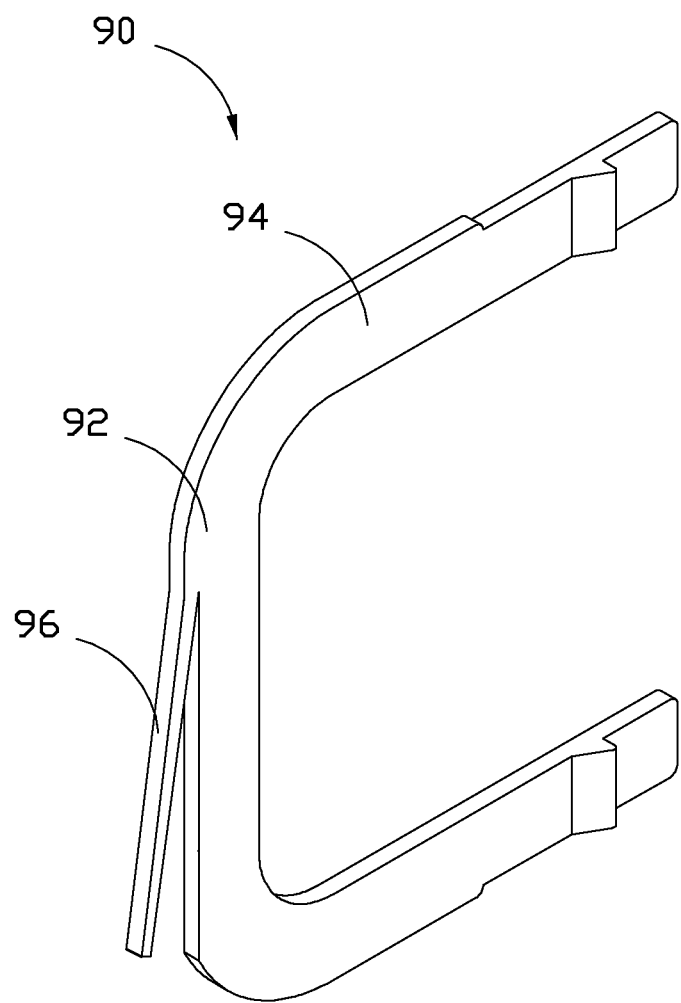
FIG. 9 is an isometric view of an operation member of a third embodiment of an electronic device.

Referring to FIG. 9, a third embodiment of an electronic device is substantially similar to the first embodiment of the electronic device, except that an operation member 90 of the electronic device of the third embodiment includes two parallel sliding arms 94, and an operation arm 92 perpendicularly connected between first ends of the sliding arms 94. A bar-shaped resilient portion 96 slantingly extends outwards from an outside surface of the operation arm 92 away from the sliding arms 94. The resilient portion 96 abuts against an inner surface of the flange 262, to urge the operation member 90 to be self-restored, thereby replacing the resilient member 80.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. An electronic device, comprising:
   a chassis comprising a sidewall bounding a receiving space, the sidewall defining a fastening hole communicating with the receiving space;
   a detachable module comprising a case received in the receiving space, the case comprising a side plate facing the sidewall and defining a through hole;
   a resilient latching member comprising a first end fixed to an inner surface of the side plate, and a second end opposite to the first end, a latching tab protruding outwards from the second end of the latching member and extending outwards through the side plate via the through hole; and
   an operation member slidably mounted to the side plate and positioned between the latching member and the side plate;
   wherein when the operation member is at a first position, the latching tab engages in the fastening hole such that the detachable module is attached to the chassis; and
   wherein when the operation member slides to a second position, it pushes against the latching member to deform the second end of the latching member to move away from the side plate, such that the latching tab is disengaged from the fastening hole, thereby detaching the detachable module from the chassis.

2. The electronic device of claim 1, wherein a wedge-shaped protrusion protrudes outwards from the operation member, the latching member forms a bending portion for receiving the protrusion, the protrusion abuts against the bending portion to deform the latching member away from the side plate.

3. The electronic device of claim 2, wherein the operation member comprises two parallel sliding arms and an operation arm connected between first ends of the sliding arms, a handle extends outwards from an end of the side plate, the operation member is slidably mounted to the handle.

4. The electronic device of claim 3, wherein the handle is substantially U-shaped, a flange protrudes from an outer edge of an inner side of the handle, two positioning pieces extend from an inner edge of the inner side of the handle, adjacent to the side plate, the flange and the positioning pieces cooperatively bound a slide slot for slidably receiving the operation member.

5. The electronic device of claim 4, wherein the protrusion forms a slanting guiding surface facing the operation arm, the bending portion comprises a slanting engaging piece slidably engaging with the guiding surface.

6. The electronic device of claim 4, further comprising an elastic member, wherein a first hook extends from a distal end of one of the sliding arms toward the other sliding arm, a second hook protrudes from the side plate, a first end of the elastic member is fastened to the first hook, and a second end of the elastic member is fastened to the second hook.

7. The electronic device of claim 4, wherein an arc-shaped resilient piece extends from a side of the operation arm away from the sliding arms, the resilient piece resiliently abuts against an inner surface of the flange to urge the operation member to be restored.

8. The electronic device of claim 4, wherein a resilient portion slantingly extends outwards from a side of the operation arm away from the sliding arms, the resilient portion resiliently abuts against an inner surface of the flange to urge the operation member to be restored.

9. The electronic device of claim 1, wherein the detachable module is a power supply.

* * * * *